(12) United States Patent
Ishida et al.

(10) Patent No.: US 8,278,821 B2
(45) Date of Patent: Oct. 2, 2012

(54) LIGHT EMITTING DEVICE

(75) Inventors: Kunio Ishida, Tokyo (JP); Iwao Mitsuishi, Tokyo (JP); Ryosuke Hiramatsu, Kanagawa (JP); Yumi Fukuda, Tokyo (JP); Keiko Albessard, Kanagawa (JP); Naotoshi Matsuda, Kanagawa (JP); Aoi Okada, Tokyo (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/033,911

(22) Filed: Feb. 24, 2011

(65) Prior Publication Data

US 2012/0056525 A1   Mar. 8, 2012

(30) Foreign Application Priority Data

Sep. 7, 2010   (JP) .................................. 2010-199984

(51) Int. Cl.
  *H05B 33/14* (2006.01)
  *H01L 33/50* (2010.01)
(52) U.S. Cl. ... 313/506; 313/503; 313/501; 252/301.4 R
(58) Field of Classification Search .................... 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS

| | | | |
|---|---|---|---|
| 7,821,188 B2 | 10/2010 | Kurihara et al. | |
| 7,884,538 B2 | 2/2011 | Mitsuishi et al. | |
| 2007/0228390 A1 | 10/2007 | Hattori et al. | |
| 2007/0235748 A1* | 10/2007 | Tamura et al. | 257/99 |
| 2009/0039375 A1* | 2/2009 | LeToquin et al. | 257/98 |
| 2010/0025632 A1* | 2/2010 | Fukuda et al. | 252/301.6 R |
| 2010/0052504 A1 | 3/2010 | Sato et al. | |

FOREIGN PATENT DOCUMENTS

| | | |
|---|---|---|
| JP | 2007-142318 | 6/2007 |
| JP | 2008-186777 | 8/2008 |

OTHER PUBLICATIONS

U.S. Appl. No. 13/221,042, filed Aug. 30, 2011, Okada, et al.
U.S. Appl. No. 13/215,659, filed Aug. 23, 2011, Ishida, et al.
U.S. Appl. No. 12/874,839, filed Aug. 2, 2010, Hikosaka, et al.
U.S. Appl. No. 13/034,137, filed Feb. 24, 2011, Mitsuishi, et al.
U.S. Appl. No. 13/033,960, filed Feb. 24, 2011, Mitsuishi, et al.
U.S. Appl. No. 13/037,838, filed Mar. 1, 2011, Matsuda, et al.

* cited by examiner

*Primary Examiner* — Mariceli Santiago
*Assistant Examiner* — Donald Raleigh
(74) *Attorney, Agent, or Firm* — Oblon, Spivak, McClelland, Maier & Neustadt, L.L.P.

(57) ABSTRACT

A light emitting device according to one embodiment includes a light emitting element that emits light having a wavelength of 250 nm to 500 nm; plural red fluorescent layers that are formed above the light emitting element to include a red fluorescent material, the red fluorescent layers being disposed at predetermined intervals; and plural green fluorescent layers that are formed above the light emitting element to include a green fluorescent material, a distance between the light emitting element and the green fluorescent layers being larger than a distance between the light emitting element and the red fluorescent layers.

18 Claims, 9 Drawing Sheets

US 8,278,821 B2

LIGHT EMITTING DEVICE

CROSS-REFERENCE TO RELATED APPLICATION

This application is based upon and claims the benefit of priority from Japanese Patent Application No. 2010-199984, filed on Sep. 7, 2010; the entire contents of which are incorporated herein by reference.

FIELD

Embodiments described herein relate generally to a light emitting device.

BACKGROUND

Recently, attention focuses on a so-called white-color Light Emitting Diode (LED) in which a yellow fluorescent material such as YAG:Ce is combined with a blue LED to emit white-color light by a single chip. Conventionally, the LED emits red, green, or blue light in monochromatic form, and it is necessary that plural LEDs emitting monochrome wavelengths are driven in order to emit the white-color light or intermediate-color light. However, currently, the combination of the light emitting diode and the fluorescent materials removes the trouble to obtain the white-color light with a simple structure.

An LED lamp in which the light emitting diode is used is applied to various display devices of a mobile device, a PC peripheral device, an OA device, various switches, a light source for backlight, and a display board. In the LED lamps, there is a strong demand for high efficiency. Additionally, there is a demand for high color rendering in general-purpose lighting applications, and there is a demand for high color gamut in backlight applications. High efficiency of the fluorescent materials is required for the purpose of the high efficiency of the LED lamp, and a white-color light source in which a fluorescent material emitting blue excitation light, a fluorescent material excited by blue light to emit green light, and a fluorescent material excited by blue light to emit red light are combined is preferable to the high color rendering and the high color gamut.

However, when plural fluorescent materials are used, luminous efficiency is degraded by reabsorption between the fluorescent materials. Particularly, when white-color light is obtained by a combination of the plural fluorescent materials, the problem becomes obvious by shortening a distance between the fluorescent materials.

DETAILED DESCRIPTION

Figure 1:
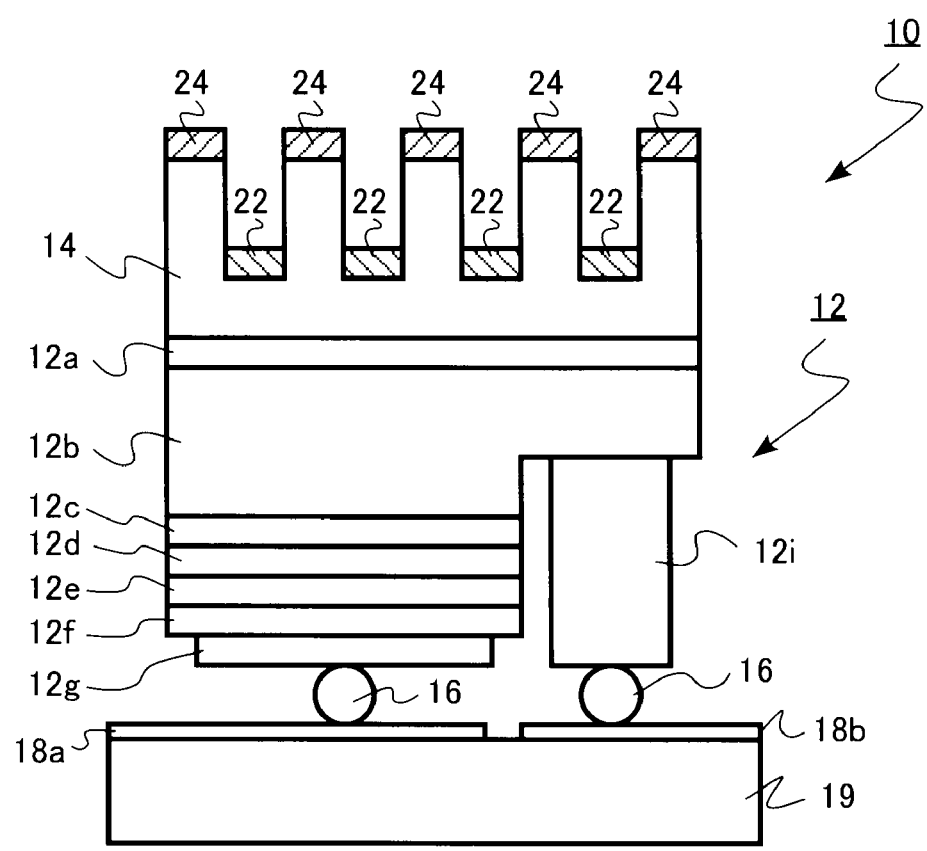
FIG. 1 is a schematic sectional view illustrating a light emitting device according to a first embodiment.

A light emitting device according to one embodiment includes a light emitting element that emits light having a wavelength of 250 nm to 500 nm; plural red fluorescent layers that are formed above the light emitting element to include a red fluorescent material, the red fluorescent layers being disposed at predetermined intervals; and plural green fluorescent layers that are formed above the light emitting element to include a green fluorescent material, a distance between the light emitting element and the green fluorescent layers being larger than a distance between the light emitting element and the red fluorescent layers.

Embodiments will be described below with reference to the drawings. In the drawings, the identical or similar point is designated by the identical or similar numeral.

As used herein, the red fluorescent material means a fluorescent material that emits light ranging from an orange color to a red color (hereinafter also collectively referred to as red color), that is, light having a peak intensity at the wavelength of 595 to 700 nm, which is longer than the excitation light, when the fluorescent material is excited by the light having the wavelength of 250 nm to 500 nm, that is, near-ultraviolet light or blue light.

As used herein, the green fluorescent material means a fluorescent material that emits light ranging from a blue-green color to a yellow-green color (hereinafter also collectively referred to as green color), that is, light having a peak intensity at the wavelength of 490 to 580 nm, which is longer than the excitation light, when the fluorescent material is excited by light having the wavelength of 250 nm to 500 nm, that is, the near-ultraviolet light or the blue light.

In the following description, a "trapezoid" is a concept including a rectangle.

First Embodiment

A light emitting device according to a first embodiment includes the light emitting element that emits light having the wavelength of 250 nm to 500 nm; the plural red fluorescent layers that are formed above the light emitting element to include the red fluorescent material, the red fluorescent layers being disposed at predetermined intervals; and the green fluorescent layers that are formed above the light emitting element to include the green fluorescent material, the plural green fluorescent layer being disposed in the position farther away from the light emitting element. The distance between the light emitting element and the green fluorescent layers is larger than the distance between the light emitting element and the red fluorescent layers.

Therefore, in the light emitting device with the above configuration of the first embodiment, the solid angle at which the red fluorescent layer is seen from the green fluorescent layer is decreased to suppress the reabsorption of green light by the red fluorescent layer. Accordingly, the light emitting device that realizes the excellent luminous efficiency can be implemented.

FIG. 1 is a schematic sectional view illustrating the light emitting device of the first embodiment. FIG. 1 illustrates the state in which the light emitting device of the first embodiment is mounted on a mounting board.

A light emitting device 10 of the first embodiment includes a blue LED chip that emits the blue light as a light emitting element 12 for excitation light source. The blue LED chip has an upper surface having a rectangle of about 300 to 600 μm, for example, a square.

A transparent medium layer (or a medium layer) 14 having projections and recesses on a surface thereof is formed on an upper surface of the light emitting element 12. A transparent medium layer (or a medium layer) 14 is transparent. For example, the transparent medium layer 14 is a sapphire substrate that is used in forming the light emitting element 12.

For example, the blue LED has a stacked structure in which a buffer layer 12a, an n-type GaN layer 12b, an n-type AlGaN layer 12c, an InGaN active layer 12d, a p-type AlgaN layer 12e, and a p-type GaN layer 12f are stacked in the order from the top of FIG. 1 while the buffer layer 12a is in contact with the sapphire substrate. A p-side electrode 12g is provided while being in contact with the p-type GaN layer 12f.

A n-side electrode 12i is provided while being in contact with the n-type GaN layer 12b in a region where the stacked structure including the p-type GaN layer 12f, the p-type AlGaN layer 12e, the InGaN active layer 12d, the n-type AlGaN layer 12c, and the n-type GaN layer 12b is partially removed by etching.

The blue LED chip has a flip-chip configuration. In the flip-chip configuration, the p-side electrode 12g and the n-side electrode 12i are formed in a metalized mounting board 19, in which metallic wiring layers 18a and 18b are formed in a surface thereof, while bumps 16 are interposed between the p-side electrode 12g and the n-side electrode 12i and the mounting board 19.

A red fluorescent layer 22 including the red fluorescent material is formed in the recesses of the sapphire transparent medium layer 14. The red fluorescent layer 22 is formed while the red fluorescent material particle is dispersed in a transparent resin layer such as a silicone resin. When the red fluorescent layer 22 is formed in the recesses, the resultant plural red fluorescent layers 22 are formed on the light emitting element 12 at predetermined intervals.

A green fluorescent layer 24 including the green fluorescent material is formed in the projections of the transparent medium layer 14. The green fluorescent layer 24 is formed while the green fluorescent material particle is dispersed in a transparent resin layer such as a silicone resin. The green fluorescent layer 24 of the first embodiment includes the plural green fluorescent layers 24 that are formed at predetermined intervals. In other words, the plural green fluorescent layers 24 are formed on the light emitting element 12 at predetermined intervals. For example, the region where the red fluorescent layer 22 is not provided between the projections in the transparent medium layer 14 is air.

In the first embodiment, so-called sialon fluorescent material is applied to the red fluorescent material and the green fluorescent material. Because the sialon fluorescent material has small degradation of the luminous efficiency at high temperature, that is, weak temperature quenching, color shift is small and the sialon fluorescent material is suitable to the implementation of the high-density-packaging or high-power light emitting device.

The red fluorescent material of the first embodiment has a composition expressed by equation (4).

$$(M_{1-x1}Eu_{x1})_a Si_b AlO_c N_d \quad (4)$$

(In the equation (4), M is an element that is selected from IA group elements, IIA group elements, IIIA group elements, IIIB group elements except Al, rare-earth elements, and IVB group elements. x1, a, b, c, and d satisfy the following relationship.

$0<x1\leq 1$, $0.60<a<0.95$, $2.0<b<3.9$, $0.04\leq c\leq 0.6$, $4<d<5.7$)

Desirably, the element M is strontium (Sr). However, the red fluorescent material is not limited to the strontium.

The green fluorescent material of the first embodiment has a composition expressed by equation (5).

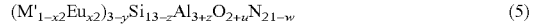
$$(M'_{1-x2}Eu_{x2})_{3-y} Si_{13-z} Al_{3+z} O_{2+u} N_{21-w} \quad (5)$$

(In the equation (5), M' is an element that is selected from IA group elements, IIA group elements, IIIA group elements, IIIB group elements except Al, rare-earth elements, and IVB group elements. x2, y, z, u, and w satisfy the following relationship.

$0<x2\leq 1$, $-0.1\leq y\leq 0.15$, $-1\leq z\leq 1$, $-1<u-w\leq 1.5$)

Desirably, the element M' is strontium (Sr). However, the green fluorescent material is not limited to the strontium.

Figure 2:
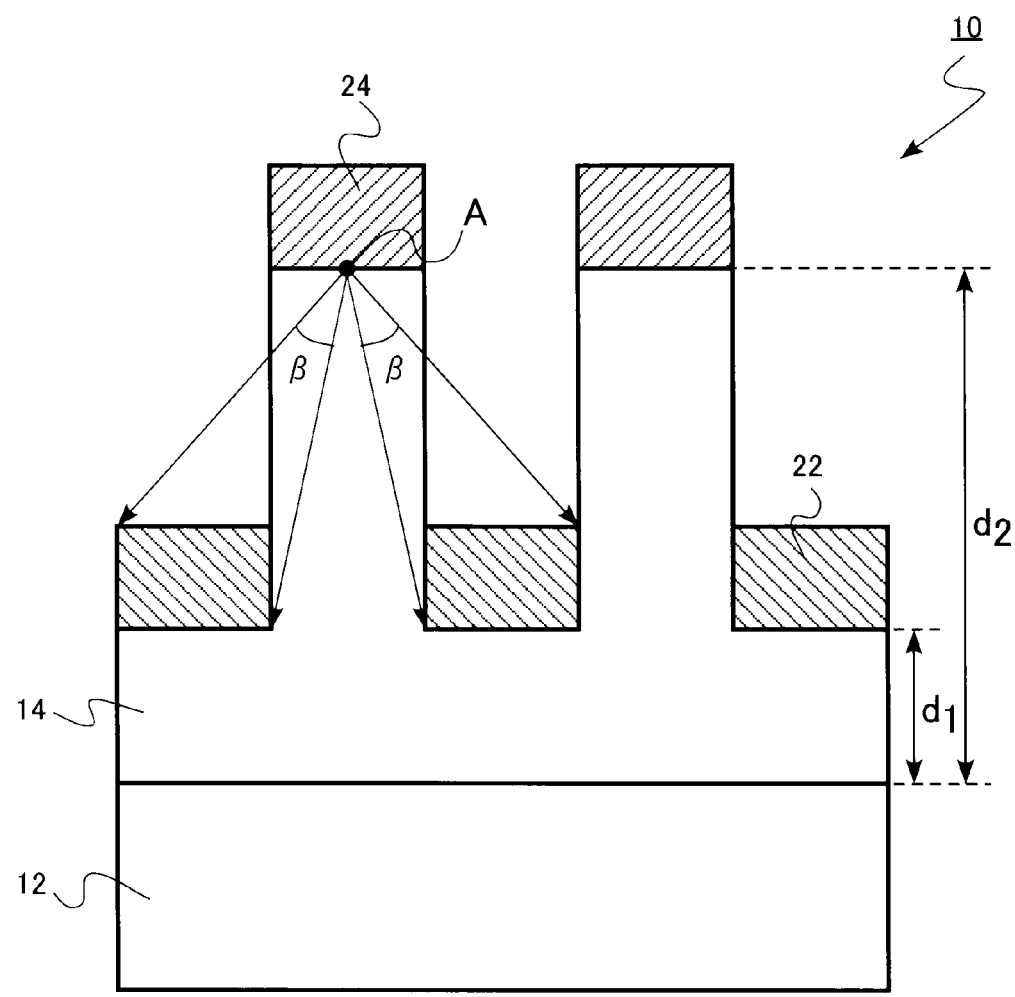
FIG. 2 is an enlarged schematic sectional view illustrating an upper portion of the light emitting device of the first embodiment.

FIG. 2 is an enlarged schematic sectional view illustrating an upper portion of the light emitting device of the first embodiment. As illustrated in FIG. 2, the green fluorescent layer 24 is formed in a projection of the transparent medium layer 14, whereby the green fluorescent layer 24 is located in a distance $d_2$ farther away from the light emitting element 12 than a distance $d_1$ between the light emitting element 12 and the red fluorescent layer 22. The distance between the light emitting element 12 and the fluorescent layer s representatively expressed by a distance to a lower surface of each fluorescent layer from an interface between the light emitting element 12 and the transparent resin layer 14. The distance may be a minimum distance between the light emitting element 12 and the fluorescent layers.

In the light emitting device 10, using the blue light emitted from the active layer 12d of the blue LED chip as the excitation light, the red light is emitted from the red fluorescent layer 22, and the green light is emitted from the green fluorescent layer 24. The light emitting device 10 emits the white-color light by mixing the blue light, the red light, and the green light.

However, the red fluorescent layer 22 is irradiated with part of the green light emitted from the green fluorescent layer 24, and the part of the green light is reabsorbed by the red fluorescent layer 22. This process causes energy loss in the fluorescent materials which degrades the luminous efficiency of the light emitting device.

In the first embodiment, the reabsorption of the green light in the red fluorescent layer 22 is reduced. For example, the green light is emitted all around from a point A of the green fluorescent layer 24. Referring to FIG. 2, in the green light, the light emitted to a range indicated by two arrows is partially reabsorbed because the red fluorescent layer 22 is irradiated with the light.

In the light emitting device 10, an angle between the arrows in FIG. 2, that is, a solid angle β at which the red fluorescent layer 22 is seen from the green fluorescent layer 24 is decreased. Therefore, a ratio of the green light with which the red fluorescent layer 22 is irradiated is decreased compared with the disposition in which the red fluorescent layer and the green fluorescent layer are adjacent to each other. Accordingly, the reabsorption in the red fluorescent layer 22 is suppressed to improve the luminous efficiency of the light emitting device.

In the light emitting device 10, the red fluorescent layer 22 and the green fluorescent layer 24 are formed in the recesses and the projections, which are provided in the sapphire substrate in which the blue LED chip is formed. Accordingly, miniaturization of the white-color light emitting device can be realized compared with the case in which the red fluorescent layer and the green fluorescent layer are provided on different blue LED chips to form the white-color light emitting module.

Figure 3:
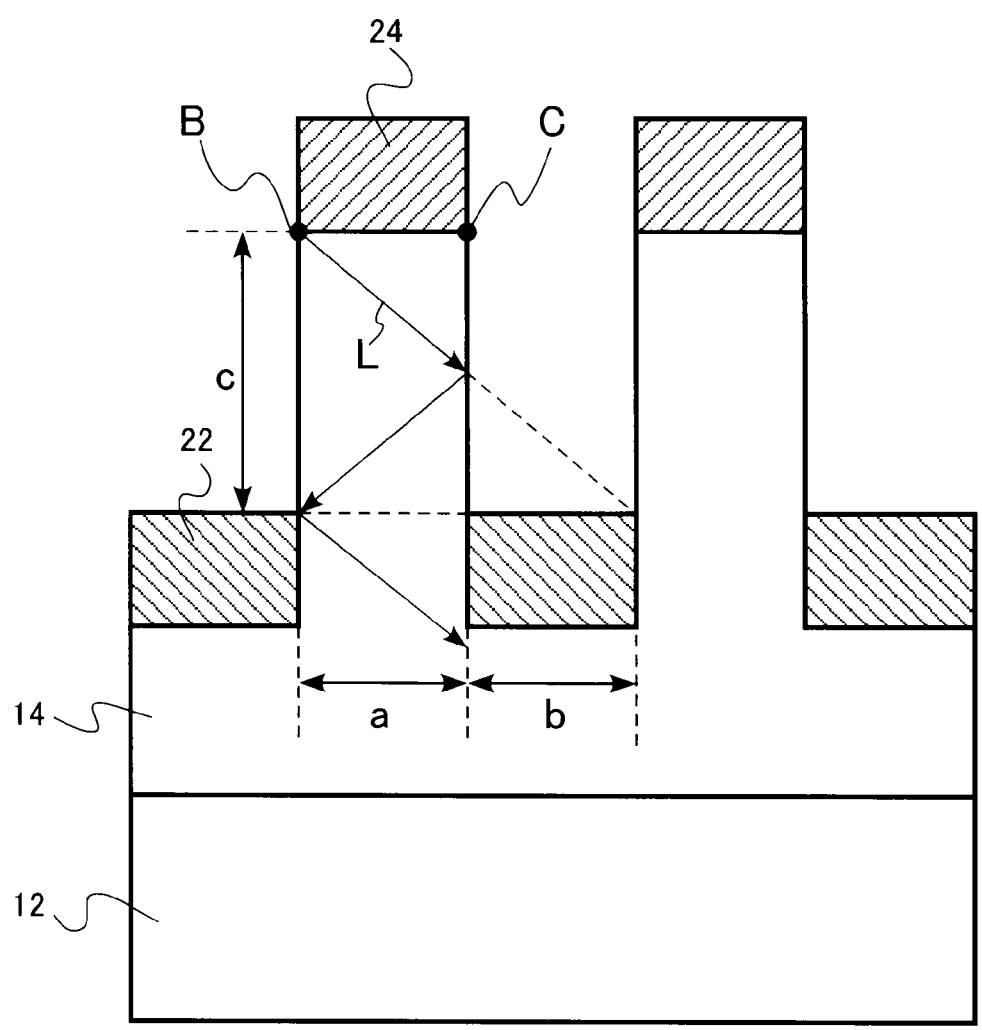
FIG. 3 is an enlarged schematic sectional view illustrating the upper portion of the light emitting device of the first embodiment.

FIG. 3 is an enlarged schematic sectional view illustrating the upper portion of the light emitting device of the first embodiment. In the first embodiment, a cross-section of the projections of the transparent medium. layer 14 above the upper surface of the red fluorescent layer 22 has a rectangular shape. Here, in the rectangle, it is assumed that a is a length of a side (base) parallel to the interface between the light emitting element 12 and the transparent medium layer 14, c is a length of a side (height) perpendicular to the interface between the light emitting element 12 and the transparent medium layer 14, and b is a gap (width of red fluorescent layer 22) between the two rectangles. It is assumed that the refractive index of air is set to 1 and the refractive index of the transparent medium layer 14 is set to n. The refractive index n becomes about 1.7 when the transparent medium layer 14 is made of sapphire.

Desirably, the following equation (3) is satisfied.

$$\frac{c}{a+b} > \frac{1}{\sqrt{n^2-1}} \quad (3)$$

In FIG. 3, when the equation (3) is satisfied, the whole of light L that emitted from a point B of the green fluorescent layer 24 toward an end portion of the farther upper surface of the adjacent red fluorescent layer 22 is totally reflected at the interface between the transparent medium layer 14 and the air. Accordingly, the red fluorescent layer 22 isnot irradiated with the light L, and the reabsorption does not take place.

When the equation (3) is satisfied, the whole of the light passing between the point B and the point C of FIG. 3, that is, from the green fluorescent layer 24 to the adjacent red fluorescent layer 22 through the transparent medium layer 14 is totally reflected at the interface between the transparent medium layer 14 and the air. Therefore, the reabsorption in the red fluorescent layer 22 is suppressed to further improve the luminous efficiency of the light emitting device.

Figure 4:
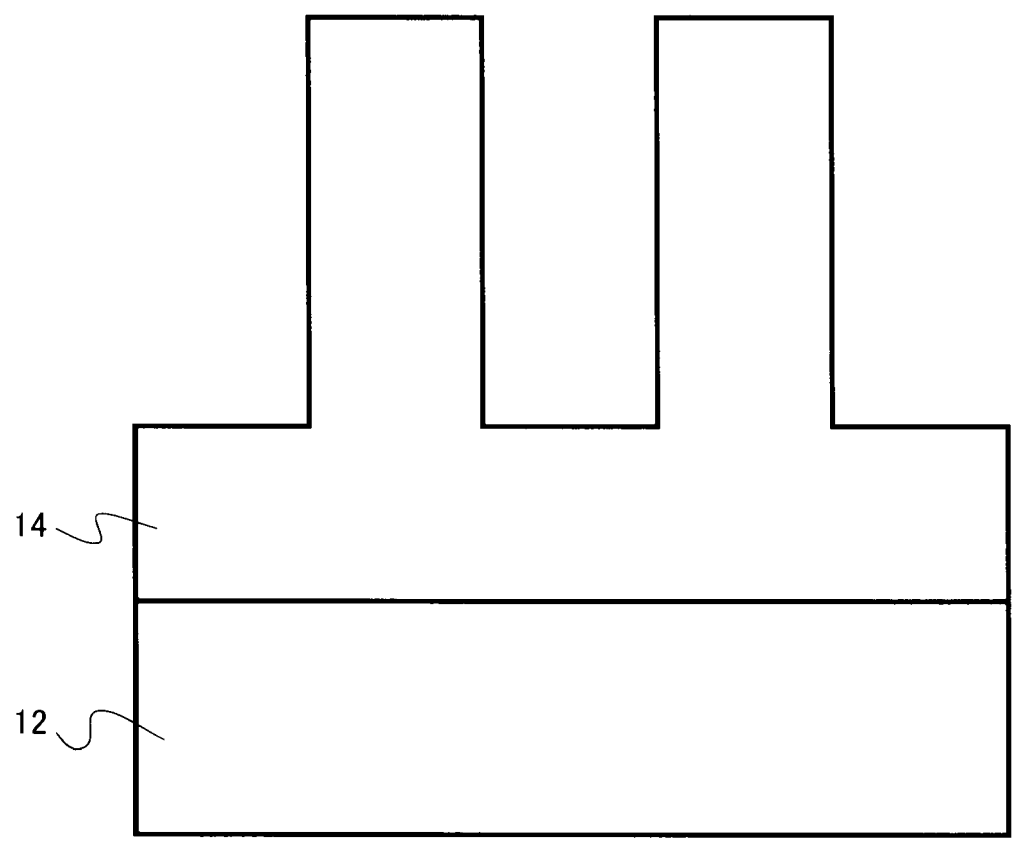
FIG. 4 is a sectional process view illustrating a method for producing the light emitting device of the first embodiment.
Figure 5:
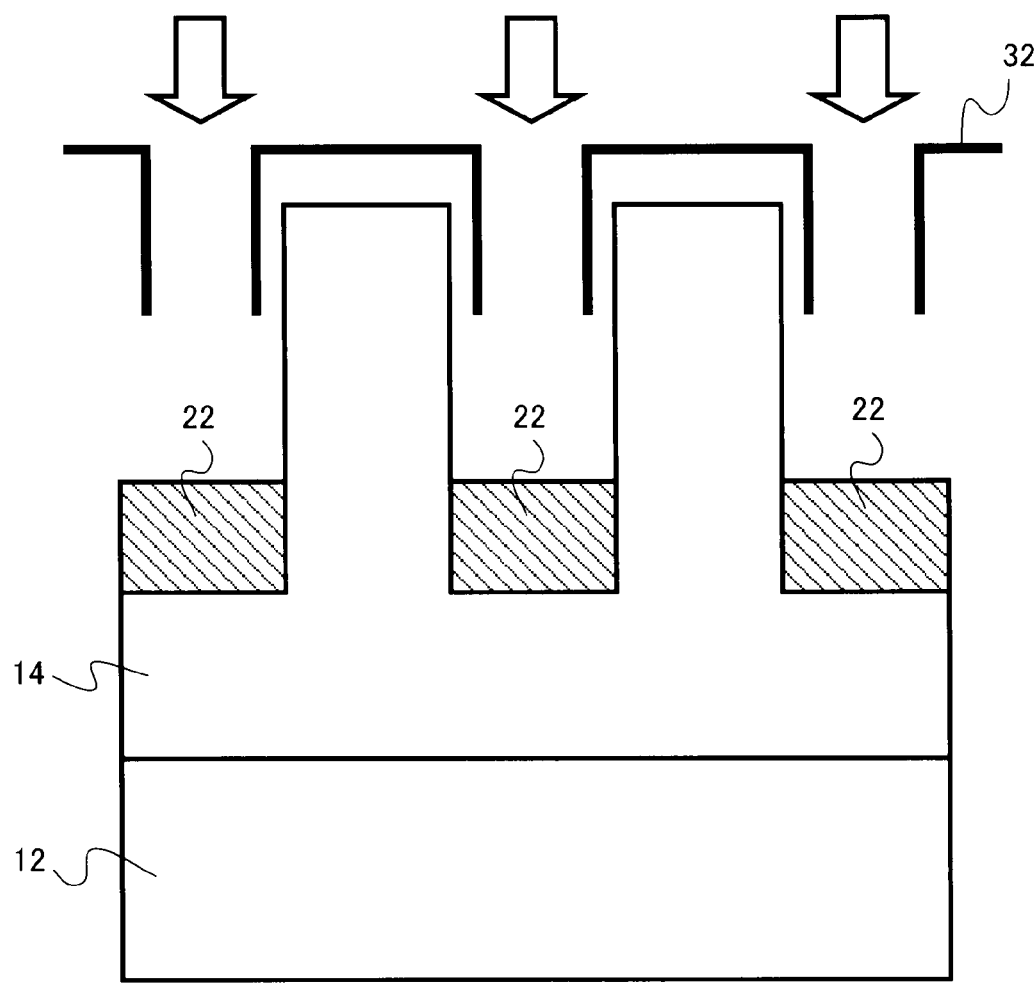
FIG. 5 is a sectional process view illustrating the method for producing the light emitting device of the first embodiment.
Figure 6:
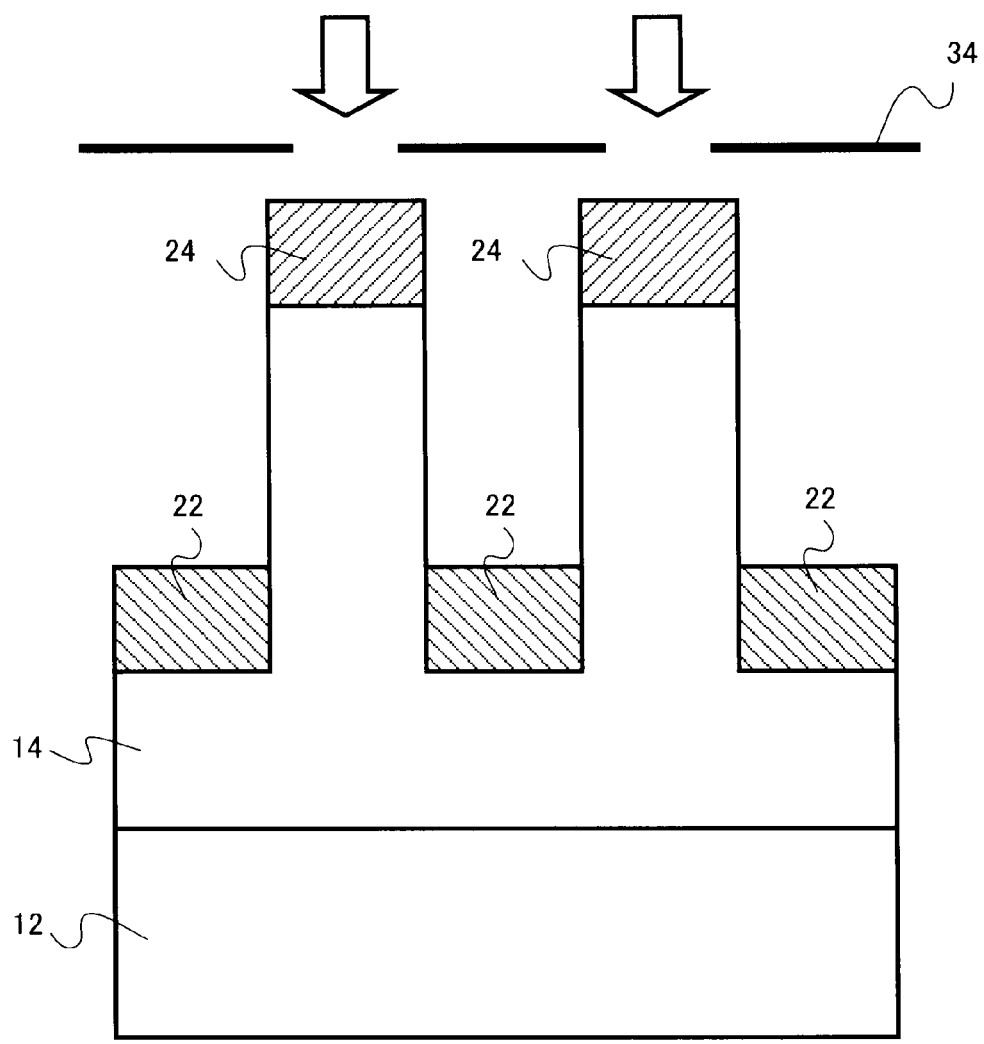
FIG. 6 is a sectional process view illustrating the method for producing the light emitting device of the first embodiment.

FIGS. 4 to 6 are sectional process views illustrating a method for producing the light emitting device of the first embodiment.

After the light emitting element 12 is formed on the sapphire substrate 14, the projections and recesses are formed by etching in the opposite surface to the light emitting element 12 on the sapphire substrate 14. Each of the projections and recesses has a width of 60 μm and a depth of 130 μm (FIG. 4).

Then, the sapphire substrate 14 is covered with a first metal mask 32 for red fluorescent material, and a resin in which the red fluorescent material is dispersed is applied from above the first metal mask 32. A size of an opening of the first metal mask 32 is set to 40 μm, and the viscosity of the resin is adjusted, whereby preventing the resin from adhering to a sidewall in the recess of the sapphire substrate 14. Therefore, for example, the red fluorescent layer 22 having a thickness of 50 μm is formed in the lowermost portion of the recess of the sapphire substrate 14 (FIG. 5).

Then, the sapphire substrate 14 is covered with a second metal mask 34 for green fluorescent material instead of the first metal mask 32, and a resin in which the green fluorescent material is dispersed is applied from above the second metal mask 34. Therefore, for example, the green fluorescent layer 24 having a thickness of 50 μm is formed on the projection of the sapphire substrate 14 (FIG. 6).

Then, the second metal mask 34 is removed, and the resins of the red fluorescent layer 22 and green fluorescent layer 24 are placed at 150° C. for 30 minutes to cure the resins. The light emitting device of the first embodiment illustrated in FIGS. 1 and 2 can simply be produced through the above-described processes.

Second Embodiment

A light emitting device according to a second embodiment differs from the light emitting device of the first embodiment in the cross-section of the upper portion above the upper surface of the red fluorescent layers in the recess of the transparent medium layer. That is, the section of the light emitting device of the second embodiment is formed into trapezoids instead of rectangles, while the cross-section of the light emitting device of the first embodiment is formed into rectangles. The descriptions of the contents overlapped with those of the first embodiment are omitted.

Figure 7:
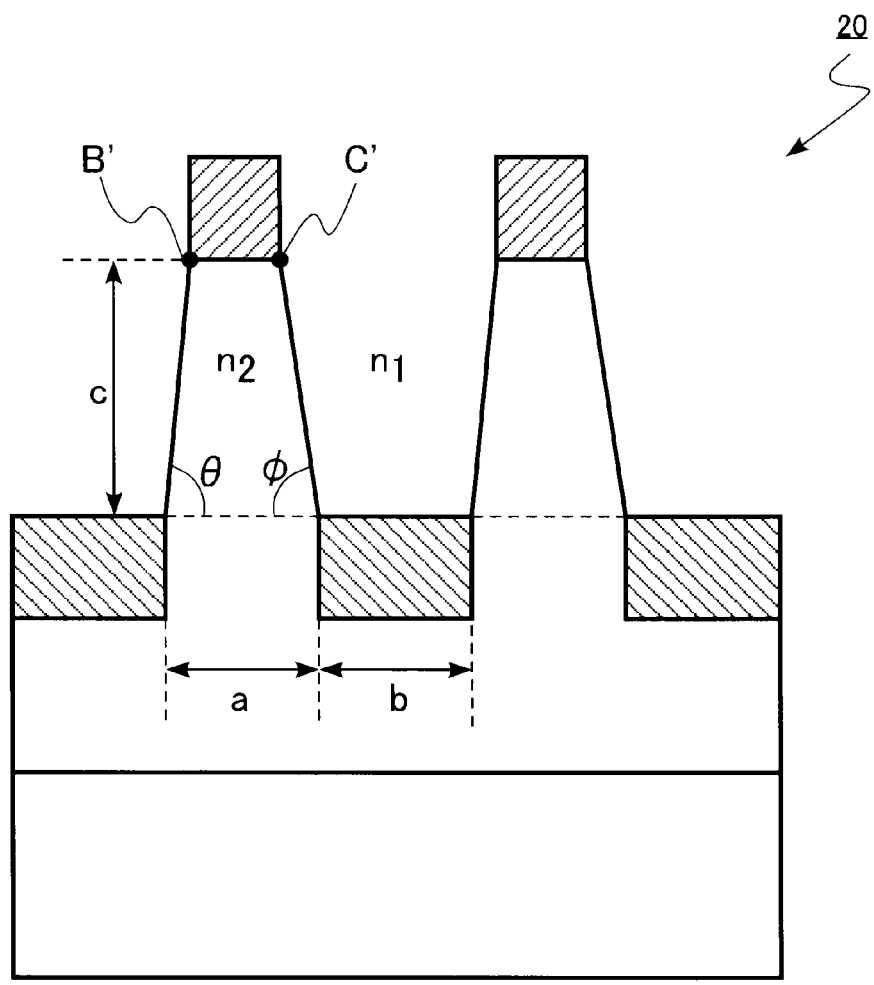
FIG. 7 is an enlarged schematic sectional view illustrating an upper portion of a light emitting device according to a second embodiment.

FIG. 7 is an enlarged schematic sectional view illustrating an upper portion of the light emitting device of the second embodiment. As illustrated in FIG. 7, a light emitting device 20 of the second embodiment is formed into the trapezoidal shape in the cross-section of the projection of the transparent medium layer 14 above the upper surface of the red fluorescent layer 22.

In the light emitting device 20 of the second embodiment, similarly to the first embodiment, the solid angle at which the red fluorescent layer 22 is seen from the green fluorescent layer 24 is decreased. Therefore, the ratio of the green light with which the red fluorescent layer 22 is irradiated is decreased. Accordingly, the reabsorption in the red fluorescent layer 22 is suppressed to improve the luminous efficiency of the light emitting device.

In the trapezoid, the side of the light emitting element 12 is set to a lower base, "a" is a length of the lower base, "c" is a height, and "θ" and "φ" are angles at end portions of the lower base. "b" is a gap between two adjacent trapezoids, and the gap b corresponds to a width of the upper surface of the red fluorescent layer 22.

In the light emitting device 20 of the second embodiment, desirably the following equations (1) and (2) are satisfied, when $n_2$ is the refractive index of the transparent medium layer while $n_1$ is the refractive index of a substance that is in contact with the two sides except the upper base and lower base of the trapezoid.

$$\frac{\tan\theta\tan\phi + \alpha(\tan\theta - \tan\phi)}{\tan\theta + \alpha(\tan\theta\tan\phi - 1)} < \sqrt{\left(\frac{n_2}{n_1}\right)^2 - 1} \qquad (1)$$

$$\frac{\tan\theta\tan\phi + \alpha(\tan\phi - \tan\theta)}{\tan\phi + \alpha(\tan\theta\tan\phi - 1)} < \sqrt{\left(\frac{n_2}{n_1}\right)^2 - 1} \qquad (2)$$

(where, $\alpha = c/(a+b)$)

When the equations (1) and (2) are satisfied, a whole of light passing between a point B' and a point C' of FIG. 7, that is, from the green fluorescent layer 24 to the adjacent red fluorescent layer 22 through the transparent medium layer 14 is totally reflected at the interface between the transparent medium layer 14 and the substance that is in contact with the two sides except the upper base and lower base of the trapezoid. Therefore, the reabsorption in the red fluorescent layer 22 is suppressed to further improve the luminous efficiency of the light emitting device.

The equation (3) of the first embodiment is equivalent to the equations (1) and (2) when θ and φ are 90 degrees and $n_1=1$ and $n_2=n$.

Third Embodiment

A light emitting device according to a third embodiment differs from the light emitting device of the first embodiment in that the green fluorescent layer are continuously formed. It means the green layer is a single layer. The descriptions of the contents overlapped with those of the first embodiment are omitted.

Figure 8:
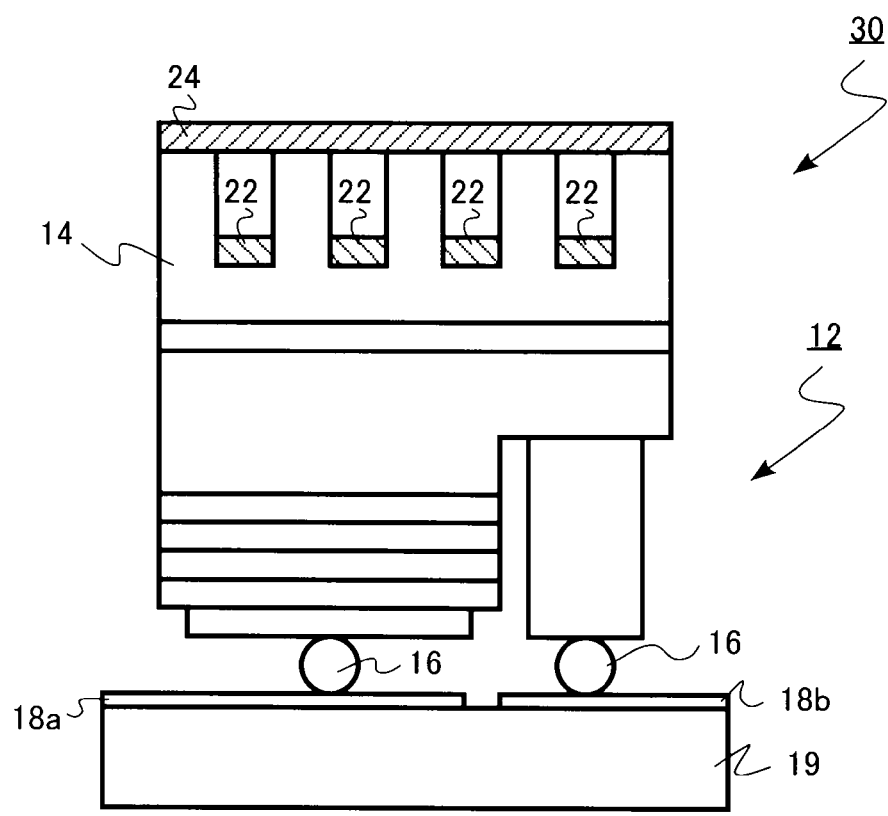
FIG. 8 is a schematic sectional view illustrating a light emitting device according to a third embodiment.

FIG. 8 is a schematic sectional view illustrating the light emitting device of the third embodiment. FIG. 8 illustrates the state in which the light emitting device of the third embodiment is mounted on a mounting board.

A light emitting device 10 of the third embodiment differs from the light emitting device 10 of the first embodiment illustrated in FIG. 1 in that the green fluorescent layer 24 formed on the projection of the transparent medium layer 14 is continuously formed. The region where the red fluorescent layer 22 is not provided between the projections of the transparent medium layer 14 is formed by the air or a transparent medium such as a silicone transparent resin.

In the light emitting device 30 of the third embodiment, similarly to the first embodiment, the solid angle at which the red fluorescent layer 22 is seen from the green fluorescent layer 24 is decreased. Therefore, the ratio of the green light with which the red fluorescent layer 22 is irradiated is decreased. Accordingly, the reabsorption in the red fluorescent layer 22 is suppressed to improve the luminous efficiency of the light emitting device.

Fourth Embodiment

A light emitting device according to a fourth embodiment differs from the light emitting device of the first embodiment in that the light emitting element is a near-ultraviolet LED chip that emits the near-ultraviolet light and the light emitting element of the fourth embodiment includes a blue fluorescent layer. The descriptions of the contents overlapped with those of the first embodiment are omitted.

Figure 9:
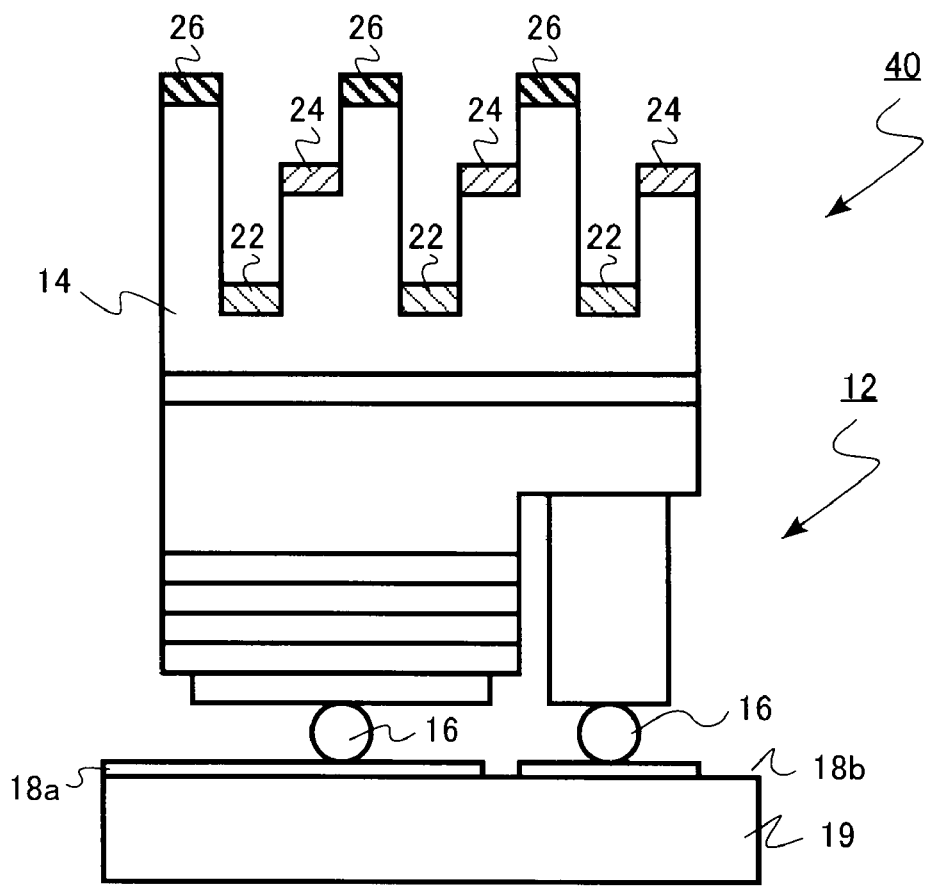
FIG. 9 is a schematic sectional view illustrating a light emitting device according to a fourth embodiment.

FIG. 9 is a schematic sectional view illustrating the light emitting device of the fourth embodiment. FIG. 8 illustrates the state in which the light emitting device of the fourth embodiment is mounted on a mounting board.

A light emitting device 40 of the fourth embodiment includes a near-ultraviolet LED chip that emits the near-ultraviolet light as the light emitting element 12 for excitation light source.

The transparent medium layer 14 having projections and recesses on a surface thereof is formed on the upper surface of the light emitting element 12. The transparent medium layer 14 has stepwise projections and recesses on the surface thereof. The stepwise projection and recess includes a recess, a first projection, and a second projection. For example, the transparent medium layer 14 is the sapphire substrate that is used in forming the light emitting element 12.

For example, the near-ultraviolet LED chip is formed while being in contact with the sapphire substrate 14. The near-ultraviolet LED chip has a flip-chip configuration. In the flip-chip configuration, the near-ultraviolet LED chip is placed on the metalized mounting board 19, in which metallic wiring layers 18a and 18b are formed in a surface thereof, while the bumps 16 made of Au (gold) are interposed between the near-ultraviolet LED chip and the wiring layers 18a and 18b.

The red fluorescent layer 22 including the red fluorescent material is formed in the recesses of the sapphire transparent medium layer 14. The red fluorescent layer 22 is formed while the red fluorescent material particle is dispersed in the transparent resin layer such as the silicone resin. When the red fluorescent layer 22 is formed in the recesses, the resultant plural red fluorescent layers 22 are formed on the light emitting element 12 at predetermined intervals.

The green fluorescent layer 24 including the green fluorescent material is formed on the first projection of the transparent medium layer 14. The green fluorescent layer 24 is formed while the green fluorescent material particle is dispersed in the transparent resin layer such as the silicone resin.

A blue fluorescent layer 26 including the blue fluorescent material is formed on the second projection of the transparent medium layer 14. That is, the blue fluorescent layer 26 is disposed in a position farther away from the light emitting element 12 than the distance between the light emitting element 12 and the green fluorescent layer 24. The blue fluorescent layer 26 is formed while the blue fluorescent material particle is dispersed in the transparent resin layer such as the silicone resin. Desirably $BaMgAl_{10}O_{17}$:Eu is used as the blue fluorescent material. However, the blue fluorescent material is not limited to the $BaMgAl_{10}O_{17}$:Eu.

For example, the region where the red fluorescent layer 22 and the green fluorescent layer 24 are not provided between the projections in the transparent medium layer 14 is air. The region may be made of the transparent resin such as the silicone resin.

In the light emitting device 40, using the near-ultraviolet light emitted from the near-ultraviolet LED chip as the excitation light, the red light is emitted from the red fluorescent layer 22, the green light is emitted from the green fluorescent layer 24, and the blue light is emitted from the blue fluorescent layer 26. The light emitting device 40 emits the white-color light by mixing the red light, the green light, and the blue light.

In the light emitting device 40, the solid angle at which the red fluorescent layer 22 is seen from the green fluorescent layer 24 is decreased. Therefore, the ratio of the green light with which the red fluorescent layer 22 is irradiated is decreased. Accordingly, the reabsorption of the green light is suppressed in the red fluorescent layer 22.

In the light emitting device 40, the solid angle at which the red fluorescent layer 22 or the green fluorescent layer 24 is seen from the blue fluorescent layer 26 is decreased. Therefore, the ratio of the blue light with which the red fluorescent layer 22 or the green fluorescent layer 24 is irradiated is decreased. Accordingly, the reabsorption of the blue light is suppressed in the red fluorescent layer 22 or the green fluorescent layer 24. Therefore, the luminous efficiency of the light emitting device can be improved.

In the light emitting device 40, the red fluorescent layer 22, the green fluorescent layer 24, and the blue fluorescent layer 26 are formed in the recesses and the projections, which are provided in the sapphire substrate 14 in which the near-ultraviolet LED chip is formed. Accordingly, the miniaturization of the white-color light emitting device can be realized compared with the case in which the red fluorescent layer, the green fluorescent layer, and the blue fluorescent layer are provided on different near-ultraviolet LED chips to form the white-color light emitting module.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

In the embodiments, the sialon fluorescent material is applied to the red fluorescent material and the green fluorescent material by way of example. From the viewpoint of suppressing the temperature quenching, particularly the fluorescent materials expressed by the equations (4) and (5) are desirably used. Alternatively, another fluorescent material may be used.

In the embodiments, $BaMgAl_{10}O_{17}:Eu$ is applied to the blue fluorescent material by way of example. From the viewpoint of improving the luminous efficiency, $BaMgAl_{10}O_{17}:Eu$ is desirably used. Alternatively, another fluorescent material may be used.

In the embodiments, the sapphire is used as the transparent medium layer by way of example. Any kind of material can be used as the material for the transparent medium layer irrespective of an inorganic material or an organic material, a resin as long as the material is substantially transparent in the neighborhood of the peak wavelength of the light emitting element (excitation element) and the wavelength range longer than the peak wavelength of the light emitting element.

Any kind of resin can be used as the resin used in the fluorescent layer and the resin with which the gap between the recesses as long as the resin is substantially transparent in the neighborhood of the peak wavelength of the light emitting element (excitation element) and the wavelength range longer than the peak wavelength of the light emitting element. Generally examples of the resin include a silicone resin, an epoxy resin, a polydimethylcyclohexan derivative having a epoxy group, an oxetane resin, an acrylic resin, a cycloolefin resin, a urea resin, a fluorine resin, and a polyimide resin.

In the embodiments, the red fluorescent layer and the green fluorescent layer are formed in the recess and projection on the surface of the transparent medium layer by way of example. The configuration is desirable from the viewpoints of the ease of the production and the reabsorption suppression in which the total reflection is utilized. Alternatively, the red fluorescent layers are formed in the surface of the sapphire substrate with no a recess and a projection at predetermined intervals, and the green fluorescent layer is provided on the red fluorescent layers with the transparent resin layer interposed therebetween.

What is claimed is:

1. A light emitting device comprising:
a light emitting element emitting light having wavelength of 250 nm to 500 nm;
red fluorescent layers formed above the light emitting element, each of the red fluorescent layers including a red fluorescent material, the red fluorescent layers being disposed at predetermined intervals;
green fluorescent layers formed above the light emitting element, each of the green fluorescent layers including a green fluorescent material, a distance between the light emitting element and the green fluorescent layers being larger than a distance between the light emitting element and the red fluorescent layers; and
a medium layer formed on the light emitting element, the medium layer being transparent, the medium layer including projections and recesses on a surface thereof, wherein
the red fluorescent layers are formed in the recesses, and the green fluorescent layers are formed on the projections.

2. The device according to claim 1, wherein
a cross-section of the medium layer above an upper surfaces of the red fluorescent layers has a shape in which trapezoids are adjacent to each other with a gap "b", a side of the light emitting element is set to a lower base, "a" is a length of the lower base, "c" is a height, and "θ" and "φ" are angles in end portions of the lower base, and equations (1) and (2) are satisfied when $n_2$ is a refractive index of the medium layer while $n_1$ is a refractive index of a substance being in contact with two sides of the trapezoidal shape;

$$\frac{\tan\theta\tan\phi + \alpha(\tan\theta - \tan\phi)}{\tan\theta + \alpha(\tan\theta\tan\phi - 1)} < \sqrt{\left(\frac{n_2}{n_1}\right)^2 - 1} \quad (1)$$

$$\frac{\tan\theta\tan\phi + \alpha(\tan\phi - \tan\theta)}{\tan\phi + \alpha(\tan\theta\tan\phi - 1)} < \sqrt{\left(\frac{n_2}{n_1}\right)^2 - 1} \quad (2)$$

(where $\alpha = c/(a+b)$).

3. The device according to claim 2 wherein equation (3) is satisfied when both the angles θ and φ are 90 degrees and $n_1=1$ and $n_2=n$.

$$\frac{c}{a+b} > \frac{1}{\sqrt{n^2 - 1}} \quad (3)$$

4. A light emitting device comprising:
a light emitting element emitting light having wavelength of 250 nm to 500 nm;
red fluorescent layers formed above the light emitting element, each of the red fluorescent layers including a red fluorescent material, the red fluorescent layers being disposed at predetermined intervals; and
green fluorescent layers formed above the light emitting element, each of the green fluorescent layers including a green fluorescent material, a distance between the light emitting element and the green fluorescent layers being larger than a distance between the light emitting element and the red fluorescent layers, wherein the red fluorescent material has a composition expressed by equation (4):

$$(M_{1-x1}Eu_{x1})_a Si_b AlO_c N_d \qquad (4)$$

(In the equation (4), M is an element that is selected from IA group elements, IIA group elements, IIIA group elements, IIIB group elements except Al (Aluminum), rare-earth elements, and IVB group elements. x1, a, b, c, and d satisfy the following relationship:

$0 < x1 \leq 1$, $0.60 < a < 0.95$, $2.0 < b < 3.9$, $0.04 \leq c \leq 0.6$, $4 < d < 5.7$).

5. The device according to claim 1, wherein the green fluorescent material has a composition expressed by equation (5):

$$(M'_{1-x2}EU_{x2})_{3-y} Si_{13-z} Al_{3+z} O_{2+u} N_{21-w} \qquad (5)$$

(In the equation (5), M' is an element that is selected from IA group elements, IIA group elements, IIIA group elements, IIIB group elements except Al (Aluminum), rare-earth elements, and IVB group elements. x2, y, z, u, and w satisfy the following relationship:

$0 < x2 \leq 1$, $-0.1 \leq y \leq 0.15$, $-1 \leq z \leq 1$, $-121\ u-w \leq 1.5$, $0 \leq w \leq 21$).

6. The device according to claim 4, wherein the green fluorescent material has a composition expressed by the equation (5):

$$(M'_{1-x2}EU_{x2})_{3-y} Si_{13-z} Al_{3+z} O_{2+u} N_{21-w} \qquad (5)$$

(In the equation (5), M' is an element that is selected from IA group elements, IIA group elements, IIIA group elements, IIIB group elements except Al, rare-earth elements, and IVB group elements. x2, y, z, u, and w satisfy the following relationship:

$0 < x2 \leq 1$, $-0.1 \leq y \leq 0.15$, $-1 \leq z \leq 1$, $-1 < u \leq w \leq 1.5$, $0 \leq w \leq 21$).

7. The device according to claim 1, wherein the medium layer is sapphire.

8. The device according to claim 1, wherein the light emitting element is a blue LED.

9. The device according to claim 4, wherein the element M is strontium (Sr).

10. A light emitting device comprising:
a light emitting element emitting light having wavelength of 250 nm to 500 nm;
red fluorescent layers formed above the light emitting element, each of the red fluorescent layers including a red fluorescent material, the red fluorescent layers being disposed at predetermined intervals;
a green fluorescent layer formed above the light emitting element, the green fluorescent layer including a green fluorescent material, a distance between the light emitting element and the green fluorescent layer being larger than a distance between the light emitting element and the red fluorescent layers; and
a medium layer formed on the light emitting element, the medium layer being transparent, the medium layer including projections and recesses on a surface thereof, wherein
the red fluorescent layers are formed in the recesses, and
the green fluorescent layer is formed on the projections.

11. The device according to claim 10, wherein
a cross-section of the medium layer above an upper surfaces of the red fluorescent layers has a shape in which trapezoids are adjacent to each other with a gap "b", a side of the light emitting element is set to a lower base, "a" is a length of the lower base, "c" is a height, and "θ" and "φ" are angles in end portions of the lower base, and
equations (1) and (2) are satisfied when $n_2$ is a refractive index of the medium layer while $n_1$ is a refractive index of a substance being in contact with two sides of the trapezoidal shape;

$$\frac{\tan\theta\tan\phi + \alpha(\tan\theta - \tan\phi)}{\tan\theta + \alpha(\tan\theta\tan\phi - 1)} < \sqrt{\left(\frac{n_2}{n_1}\right)^2 - 1} \qquad (1)$$

$$\frac{\tan\theta\tan\phi + \alpha(\tan\phi - \tan\theta)}{\tan\phi + \alpha(\tan\theta\tan\phi - 1)} < \sqrt{\left(\frac{n_2}{n_1}\right)^2 - 1} \qquad (2)$$

(where $\alpha = c/(a+b)$).

12. The device according to claim 11, wherein equation (3) is satisfied when both the angles θ and φ are 90 degrees and $n_1=1$ and $n_2=n$.

$$\frac{c}{a+b} > \frac{1}{\sqrt{n^2-1}} \qquad (3)$$

13. A light emitting device comprising:
a light emitting element emitting light having wavelength of 250 nm to 500 nm,
red fluorescent layers formed above the light emitting element, each of the red fluorescent layers including a red fluorescent material, the red fluorescent layers being disposed at predetermined intervals; and
a green fluorescent layer formed above the light emitting element, the green fluorescent layer including a green fluorescent material, a distance between the light emitting element and the green fluorescent layer being larger than a distance between the light emitting element and the red fluorescent layers,
wherein the red fluorescent material has a composition expressed by equation (4):

$$(M_{1-x1}Eu_{x1})_a Si_b AlO_c N_d \qquad (4)$$

(In the equation (4), M is an element that is selected from IA group elements, IIA group elements, IIIA group elements, IIIB group elements except Al (Aluminum), rare-earth elements, and IVB group elements x1, a, b, c, and d satisfy the following relationship:

$0 < x1 \leq 1,$ $0.60 < a < 0.95,$ $2.0 < b < 3.9,$ $0.04 \leq c \leq 0.6,$ $4 < d < 5.7).$ 14. The device according to claim 10, wherein the green fluorescent material has a composition expressed by equation (5):

$$(M'_{1-x2}Eu_{x2})_{3-y}Si_{13-z}Al_{3+z}O_{2+u}N_{21-w} \quad (5)$$

(In the equation (5), M' is an element that is selected from IA group elements, IIA group elements, IIIA group elements, IIIB group elements except Al (Aluminum), rare-earth elements, and IVB group elements. x2, y, z, u, and w satisfy the following relationship:

$0 < x2 \leq 1,$ $-0.1 \leq y \leq 0.15,$ $-1 \leq z \leq 1,$ $-1 < u-w \leq 1.5,$ $0 \leq w \leq 21).$ 15. The device according to claim 13, wherein the green fluorescent material has a composition expressed by the equation (5):

$$(M'_{1-x2}Eu_{x2})_{3-y}Si_{13-z}Al_{3+z}O_{2+u}N_{21-w} \quad (5)$$

(In the equation (5), M' is an element that is selected from IA group elements, IIA group elements, IIIA group elements, IIIB group elements except Al, rare-earth elements, and IVB group elements. x2, y, z, u, and w satisfy the following relationship:

$0 < x2 \leq 1,$ $-0.1 \leq y \leq 0.15,$ $-1 < z < 1,$ $-1 < u-w \leq 1.5,$ $0 \leq w \leq 21).$ 16. The device according to claim 10, wherein the medium layer is sapphire.

17. The device according to claim 10, wherein the light emitting element is a blue LED.

18. The device according to claim 13, wherein the element M is strontium (Sr).

* * * * *